(12) United States Patent
Silveira et al.

(10) Patent No.: US 12,197,190 B2
(45) Date of Patent: Jan. 14, 2025

(54) LIQUID COOLING LEAKAGE ABATEMENT SYSTEM AND METHOD OF USING THE SAME

(71) Applicant: Dell Products, L.P., Round Rock, TX (US)

(72) Inventors: Alaric J. Silveira, Austin, TX (US); Pushkala Iyer, Round Rock, TX (US); Sudhir Vittal Shetty, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 540 days.

(21) Appl. No.: 17/492,829

(22) Filed: Oct. 4, 2021

(65) Prior Publication Data

US 2023/0109137 A1 Apr. 6, 2023

(51) Int. Cl.
*H05K 7/20* (2006.01)
*G05B 19/416* (2006.01)
*G06Q 30/0283* (2023.01)
*G08B 21/18* (2006.01)

(52) U.S. Cl.
CPC ..... *G05B 19/4166* (2013.01); *G06Q 30/0283* (2013.01); *G08B 21/18* (2013.01); *H05K 7/20781* (2013.01); *G05B 2219/50324* (2013.01)

(58) Field of Classification Search
CPC .................. G08B 21/18; G05B 2219/50324
See application file for complete search history.

(56) References Cited

U.S. PATENT DOCUMENTS

| | | | |
|---|---|---|---|
| 11,553,627 B1* | 1/2023 | Gregory | H05K 7/20781 |
| 2013/0292319 A1* | 11/2013 | Fulkerson | A61M 1/16 210/321.78 |
| 2015/0066396 A1* | 3/2015 | Quist | G01F 1/74 702/45 |
| 2016/0270259 A1* | 9/2016 | Chainer | H05K 7/20272 |
| 2017/0181329 A1* | 6/2017 | Shelnutt | H05K 7/20781 |
| 2021/0209923 A1* | 7/2021 | Kumura | G08B 21/18 |
| 2022/0071049 A1* | 3/2022 | Heydari | H05K 7/2079 |
| 2022/0390195 A1* | 12/2022 | Gao | F28F 27/02 |

* cited by examiner

*Primary Examiner* — Mohammad Ali
*Assistant Examiner* — Vincent W Chang
(74) *Attorney, Agent, or Firm* — Fogarty LLP

(57) ABSTRACT

According to one embodiment, a liquid cooling leakage abatement system includes a systems manager having executable instructions for obtaining location information for each of a plurality of components of a computing cluster in which at least a portion of the components are cooled by a liquid cooling system via a liquid coolant. When the systems manager receives leakage information associated with a leak in the liquid cooling system used to cool a first component, it infers a second component that is affected by the leak, and generates an alert message indicating that the first and second components that are affected by the leak.

16 Claims, 5 Drawing Sheets

LIQUID COOLING LEAKAGE ABATEMENT SYSTEM AND METHOD OF USING THE SAME

FIELD

The present disclosure generally relates to Information Handling Systems (IHSs), and, more particularly, to a liquid cooling leakage abatement system and method of using the same.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as enterprise blade servers that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

Racks provide a means for densely housing relatively large numbers of individual computing devices. A principal challenge with such dense packaging often involves providing sufficient cooling for each of the computing devices. As such, many newer computing rack designs have implemented liquid cooling systems, such as liquid immersion cooling, or liquid cooling provided by cold plates that are thermally coupled to the principal heat generating components of the computing device. Nevertheless, liquid immersion cooling has been cumbersome to use due in large part, to difficulty in maintenance of the components that require liquid removal prior to servicing those components. Cold plates would be an enticing alternative to liquid immersion techniques, but leaks that inevitably form in the various components of the cold plate cooling system can often causes damage to the components of the computing device. It is with these concerns in mind, that embodiments of the present disclosure are disclosed herein.

SUMMARY

According to one embodiment, a liquid cooling leakage abatement system includes a systems manager having executable instructions for obtaining location information for each of a plurality of components of a computing cluster in which at least a portion of the components are cooled by a liquid cooling system via a liquid coolant. When the systems manager receives leakage information associated with a leak in the liquid cooling system used to cool a first component, it infers a second component that is affected by the leak, and generates an alert message indicating that the first and second components that are affected by the leak.

According to another embodiment, a liquid cooling leakage abatement method includes the step of obtaining location information for each of multiple components of a computing cluster in which at least a portion of the components are cooled by a liquid cooling system using a liquid coolant. The liquid cooling leakage abatement method also includes the step of when leakage information associated with a leak in the liquid cooling system used to cool a first component is received, inferring a second component that is affected by the leak, and generating an alert message indicating that the first and second components are affected by the leak.

According to yet another embodiment, a computer program product comprises a computer readable storage medium that stores a systems manager to obtain location information for each of multiple components of a computing cluster. At least a portion of the components are cooled by a liquid cooling system using a liquid coolant. The systems manager also performs the acts of when leakage information associated with a leak in the liquid cooling system used to cool a first component, inferring a second component that is affected by the leak, and generating an alert message indicating the first and second components that are affected by the leak.

BRIEF DESCRIPTION OF THE DRAWINGS

The present invention(s) is/are illustrated by way of example and is/are not limited by the accompanying figures. Elements in the figures are illustrated for simplicity and clarity and have not necessarily been drawn to scale.

DETAILED DESCRIPTION

As described previously, liquid cooling for computing racks have become an attractive alternative to air cooling due in large part, to the relatively dense housing of their constituent components, which can each generate relatively large levels of heat. Liquid cooling is being adopted in many data centers due to significant reduction in operational expenditures compared to air cooled systems. Liquid cooled systems usually utilize a cold plate that replaces the CPU's heat sink in which the cold plate is cooled using flexible conduits that circulate a liquid, such as a water, or a blend of water and other water-based materials. While there are advantages to liquid cooling, such as reduced power consumption, noise reduction and increased space utilization, risks associated with leaks exist, such as hardware loss and workload interruptions. Consequently, baseboard management controllers (BMCs) include a leak sensor, to detect and report leaks at the server level. One particular type of BMC may be an integrated Dell Remote Access Controller (iDRAC) from Dell®.

A data center typically refers to a number of computing racks that are disposed within a single location, such as a building. Systems management appliances, such as the OpenManage Enterprise systems manager Dell® have been developed to interact with the components (e.g., cooling units, power distribution units (PDUs), etc.) of the computing racks in data centers. These Systems management appliances can also make inferences of impact, based on inventory information it stores. With liquid cooling being considered for more than just CPUs, other components (e.g., GPUs, DIMMs, etc.) have increased the need for detection, inferencing, and immediate reactive control.

At a datacenter administration level, the mechanisms to estimate and notify impending disaster in a liquid cooling leakage scenario or to take appropriate control measures have heretofore been insufficient. For example, conventional systems manager implementations have heretofore not integrated its inventory information with leakage information that may be obtained using leakage sensors configured on the computing devices. Additionally, those systems manager implementations have not exploited the benefit of estimating an impact due to a detected leak to other nearby components, or how to provide an appropriate notification so that a user or administrator of the data center may take appropriate remediation measures. As will be described in detail herein below, embodiments of the present disclosure provide a liquid cooling leakage monitoring and abatement system and method that provides a solution to the aforementioned problems with conventional systems manager implementations.

Figure 1:
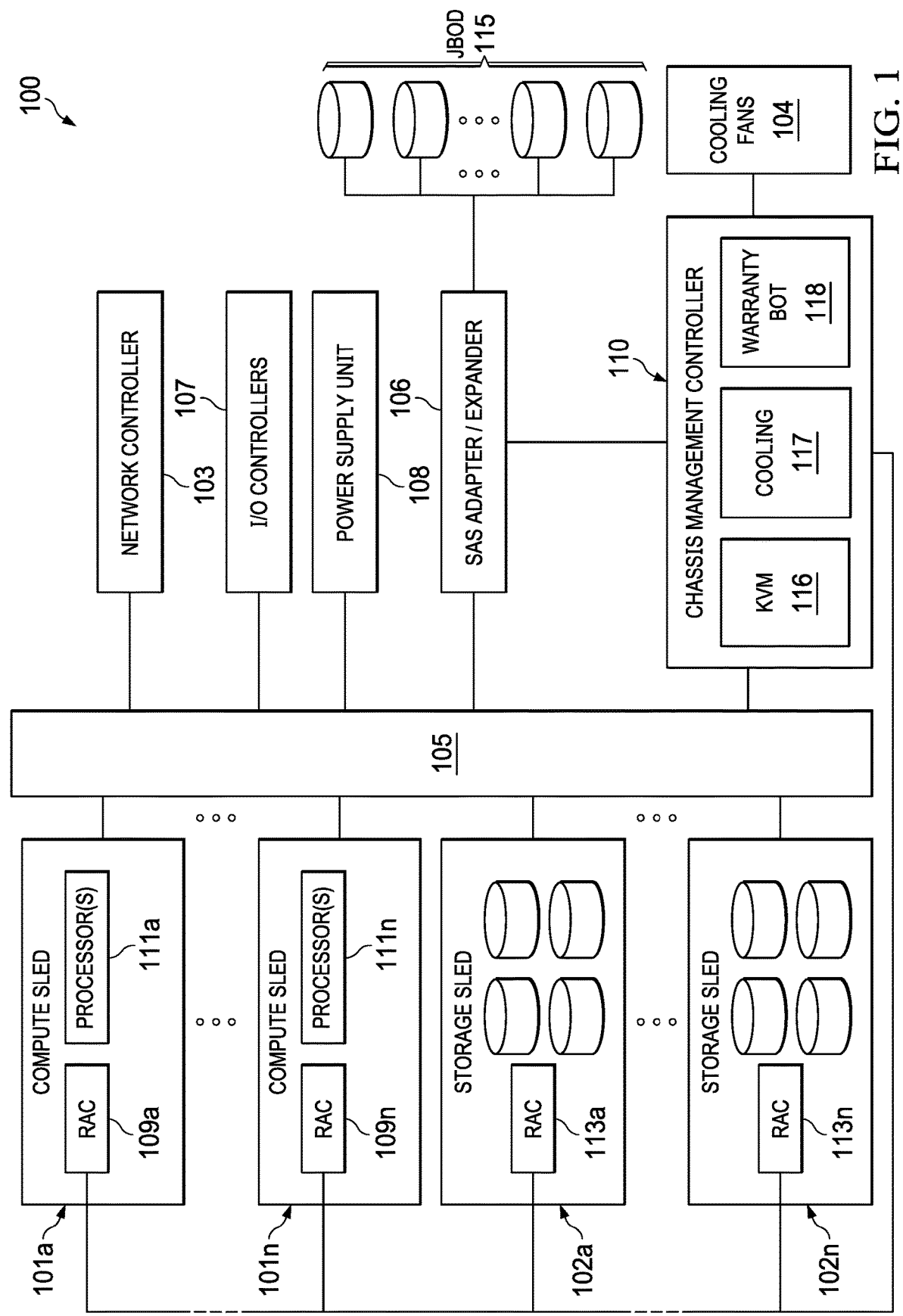
FIG. 1 is a block diagram illustrating certain components of a chassis comprising one or more compute sleds and one or more storage sleds that may be configured to implement the systems and methods described herein.

FIG. 1 is a block diagram illustrating certain components of a chassis 100 comprising one or more compute sleds 101a-n and one or more storage sleds 102a-n that may be configured to implement the systems and methods described herein. As described in additional detail below, each of the sleds 101a-n, 102a-n may be separately licensed hardware components and each of the sleds may also operate using a variety of licensed hardware and software features. Chassis 100 may include one or more bays that each receive an individual sled (that may be additionally or alternatively referred to as a tray, blade, and/or node), such as compute sleds 101a-n and storage sleds 102a-n. Chassis 100 may support a variety of different numbers (e.g., 4, 8, 16, 32), sizes (e.g., single-width, double-width), and physical configurations of bays. Other embodiments may include additional types of sleds that provide various types of storage and/or processing capabilities. Other types of sleds may provide power management and networking functions. Sleds may be individually installed and removed from the chassis 100, thus allowing the computing and storage capabilities of a chassis to be reconfigured by swapping the sleds with different types of sleds, in many cases without affecting the operations of the other sleds installed in the chassis 100.

By configuring a chassis 100 with different sleds, the chassis may be adapted to support specific types of operations, thus providing a computing solution that is directed toward a specific type of computational task. For instance, a chassis 100 that is configured to support artificial intelligence computing solutions may include additional compute sleds, compute sleds that include additional processors, and/or compute sleds that include specialized artificial intelligence processors or other specialized artificial intelligence components, such as specialized FPGAs. In another example, a chassis 100 configured to support specific data mining operations may include network controllers 103 that support high-speed couplings with other similarly configured chassis, thus supporting high-throughput, parallel-processing computing solutions.

In another example, a chassis 100 configured to support certain database operations may be configured with specific types of storage sleds 102a-n that provide increased storage space or that utilize adaptations that support optimized performance for specific types of databases. In other scenarios, a chassis 100 may be configured to support specific enterprise applications, such as by utilizing compute sleds 101a-n and storage sleds 102a-n that include additional memory resources that support simultaneous use of enterprise applications by multiple remote users. In another example, a chassis 100 may include compute sleds 101a-n and storage sleds 102a-n that support secure and isolated execution spaces for specific types of virtualized environments. In some instances, specific combinations of sleds may comprise a computing solution, such as an artificial intelligence system, that may be licensed and supported as a computing solution.

Multiple chassis 100 may be housed within a rack. Data centers may utilize large numbers of racks, with various different types of chassis installed in the various rack configurations. The modular architecture provided by the sleds, chassis, and rack allow for certain resources, such as cooling, power, and network bandwidth, to be shared by the compute sleds 101a-n and the storage sleds 102a-n, thus providing efficiency improvements, and supporting greater computational loads.

Chassis 100 may be installed within a rack structure that provides all or part of the cooling utilized by chassis 100. For airflow cooling, a rack may include one or more banks of cooling fans that may be operated to ventilate heated air away from a chassis 100 that is housed within a rack. Chassis 100 may alternatively or additionally include one or more cooling fans 104 that may be similarly operated to ventilate heated air from within the sleds 101a-n, 102a-n installed within the chassis. A rack and a chassis 100 installed within the rack may utilize various configurations and combinations of cooling fans 104 to cool the sleds 101a-n, 102a-n and other components housed within chassis 100.

Sleds 101a-n, 102a-n may be individually coupled to chassis 100 via connectors. The connectors may correspond to bays provided in the chassis 100 and may physically and electrically couple an individual sled 101a-n, 102a-n to a backplane 105. Chassis backplane 105 may be a printed circuit board that includes electrical traces and connectors that are configured to route signals between the various components of chassis 100. In various embodiments, backplane 105 may include various additional components, such as cables, wires, midplanes, backplanes, connectors, expansion slots, and multiplexers. In certain embodiments, backplane 105 may be a motherboard that includes various electronic components installed thereon. In some embodiments, components installed on a motherboard-type backplane 105 may include components that implement all or part of the functions described with regard to components such as network controller 103, SAS (Serial Attached SCSI) adapter/expander 106, I/O controllers 107, and power supply unit 108.

Figure 2:
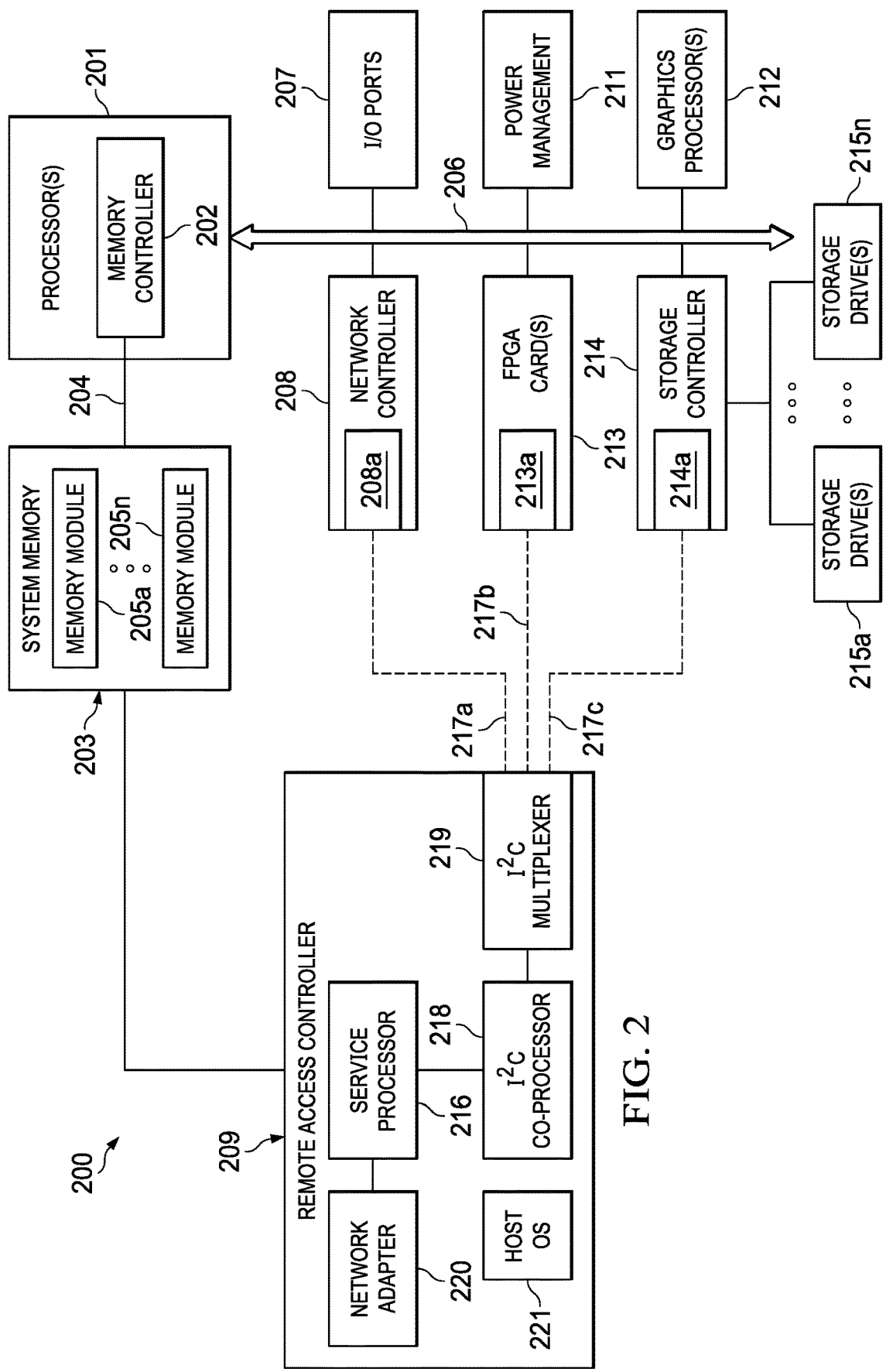
FIG. 2 illustrates an example IHS configured to implement the systems and methods described herein.

In certain embodiments, a compute sled 101*a-n* may be an IHS, such as described with regard to IHS 200 of FIG. 2. A compute sled 101*a-n* may provide computational processing resources that may be used to support a variety of e-commerce, multimedia, business, and scientific computing applications. In some cases, these applications may be provided as services via a cloud implementation. Compute sleds 101*a-n* are typically configured with hardware and software that provide leading-edge computational capabilities. Accordingly, services provided using such computing capabilities are typically provided as high-availability systems that operate with minimum downtime. Compute sleds 101*a-n* may be configured for general-purpose computing or may be optimized for specific computing tasks in support of specific computing solutions. A compute sled 101*a-n* may be a licensed component of a data center and may also operate using various licensed hardware and software systems.

As illustrated, each compute sled 101*a-n* includes a remote access controller (RAC) 109*a-n*. As described in additional detail with regard to FIG. 2, a remote access controller 109*a-n* provides capabilities for remote monitoring and management of each compute sled 101*a-n*. In support of these monitoring and management functions, remote access controllers 109*a-n* may utilize both in-band and sideband (i.e., out-of-band) communications with various internal components of a compute sled 101*a-n* and with other components of chassis 100. Remote access controller 109*a-n* may collect sensor data, such as temperature sensor readings, from components of the chassis 100 in support of airflow cooling of the chassis 100 and the sleds 101*a-n*, 102*a-n*. Also as described in additional detail with regard to FIG. 2, remote access controllers 109*a-n* may support communications with chassis management controller 110 where these communications may report on the status of hardware and software systems on a particular sled 101*a-n*, 102*a-n*, such as information regarding leakage detection for a particular hardware and/or software system.

A compute sled 101*a-n* may include one or more processors 111*a-n* that support specialized computing operations, such as high-speed computing, artificial intelligence processing, database operations, parallel processing, graphics operations, streaming multimedia, and/or isolated execution spaces for virtualized environments. Using such specialized processor capabilities of a compute sled 101*a-n*, a chassis 100 may be adapted for a particular computing solution.

In some embodiments, each compute sled 101*a-n* may include a storage controller that may be utilized to access storage drives that are accessible via chassis 100. Some of the individual storage controllers may provide support for RAID (Redundant Array of Independent Disks) configurations of logical and physical storage drives, such as storage drives provided by storage sleds 102*a-n*. In some embodiments, some or all of the individual storage controllers utilized by compute sleds 101*a-n* may be HBAs (Host Bus Adapters) that provide more limited capabilities in accessing physical storage drives provided via storage sleds 102*a-n* and/or via SAS adapter/expander 106.

As illustrated, chassis 100 also includes one or more storage sleds 102*a-n* that are coupled to the backplane 105 and installed within one or more bays of chassis 100 in a similar manner to compute sleds 101*a-n*. Each of the individual storage sleds 102*a-n* may include various different numbers and types of storage devices. For instance, storage sleds 102*a-n* may include SAS (Serial Attached SCSI) magnetic disk drives, SATA (Serial Advanced Technology Attachment) magnetic disk drives, solid-state drives (SSDs), and other types of storage drives in various combinations. The storage sleds 102*a-n* may be utilized in various storage configurations by the compute sleds 101*a-n* that are coupled to chassis 100. As illustrated, each storage sled 102*a-n* may include a remote access controller (RAC) 113*a-n*. Remote access controllers 113*a-n* may provide capabilities for remote monitoring and management of storage sleds 102*a-n* in a similar manner to the remote access controllers 109*a-n* in compute sleds 101*a-n*.

In addition to the data storage capabilities provided by storage sleds 102*a-n*, chassis 100 may provide access to other storage resources that may be installed as components of chassis 100 and/or may be installed elsewhere within a rack housing the chassis 100, such as within a storage blade. In certain scenarios, storage resources 115 may be accessed via SAS adapter/expander 106 that is coupled to backplane 105 of chassis 100. For example, SAS adapter/expander 106 may support connections to a number of JBOD (Just a Bunch Of Disks) storage drives 115 that may be configured and managed individually and without implementing data redundancy across the various drives. The additional storage resources may also be at various other locations within the data center in which chassis 100 is installed. Such additional storage resources may also be remotely located from chassis 100.

As illustrated, the chassis 100 of FIG. 1 includes a network controller 103 that provides network access to the sleds 101*a-n*, 102*a-n* installed within the chassis. Network controller 103 may include various switches, adapters, controllers, and couplings used to connect chassis 100 to a network, either directly or via additional networking components and connections provided via a rack in which chassis 100 is installed. In some embodiments, network controllers 103 may be replaceable components that include capabilities that support certain computing solutions, such as network controllers 103 that interface directly with network controllers from other chassis in support of clustered processing capabilities that utilize resources from multiple chassis.

Chassis 100 may also include a power supply unit 108 that provides the components of the chassis with various levels of DC power from an AC power source or from power delivered via a power system provided by the rack within which chassis 100 is installed. In certain embodiments, power supply unit 108 may be implemented within a sled that may provide chassis 100 with redundant, hot-swappable power supply units. In such embodiments, power supply unit 108 is a replaceable component that may be used in support of certain computing solutions.

Chassis 100 may also include various I/O controllers 107 that may support various I/O ports, such as USB ports that may be used to support keyboard and mouse inputs and/or video display capabilities. I/O controllers 107 may be utilized by a chassis management controller 110 to support various KVM (Keyboard, Video and Mouse) 116 capabilities that provide administrators with the ability to interface with the chassis 100.

In addition to providing support for KVM 116 capabilities for administering chassis 100, chassis management controller 110 may support various additional functions for sharing the infrastructure resources of chassis 100. In some scenarios, chassis management controller 110 may implement tools for managing the network controller 103, power supply unit 108, and cooling fans 104 that are available via the chassis 100. As described, the airflow cooling 104 utilized by chassis 100 may include an airflow cooling system that is provided by a rack in which the chassis 100 may be installed and managed by a cooling module 117 of the chassis management controller 110.

As described, components of chassis 100 such as compute sleds 101a-n and storage sleds 102a-n may include remote access controllers 109a-n, 113a-n that may collect information regarding the warranties for hardware and software systems on each sled. Chassis management controller 110 may similarly collect and report information regarding the warranties for hardware and software systems on each sled.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail with respect to FIG. 2.

FIG. 2 illustrates an example IHS 200 configured to implement the systems and methods described herein. It should be appreciated that although the embodiments described herein may describe an IHS that is a compute sled or similar computing component that may be deployed within the bays of a chassis, other embodiments may be utilized with other types of IHSs. In the illustrative embodiment of FIG. 2, IHS 200 may be a computing component, such as compute sled 101a-n, that is configured to share infrastructure resources provided by a chassis 100 in support of specific computing solutions.

IHS 200 may be a compute sled that is installed within a large system of similarly configured IHSs that may be housed within the same chassis, rack and/or data center. IHS 200 may utilize one or more processors 201. In some embodiments, processors 201 may include a main processor and a co-processor, each of which may include a plurality of processing cores that, in certain scenarios, may each be used to run an instance of a server process. In certain embodiments, one, some or all processors 201 may be graphics processing units (GPUs). In some embodiments, one, some or all processors 201 may be specialized processors, such as artificial intelligence processors or processors adapted to support high-throughput parallel processing computations. As described, such specialized adaptations of IHS 200 may be used to implement specific computing solutions support by the chassis in which IHS 200 is installed.

As illustrated, processor 201 includes an integrated memory controller 202 that may be implemented directly within the circuitry of the processor 201, or memory controller 202 may be a separate integrated circuit that is located on the same die as the processor 201. Memory controller 202 may be configured to manage the transfer of data to and from a system memory 203 of the IHS 200 via a high-speed memory interface 204.

System memory 203 is coupled to processor 201 via a memory bus 204 that provides the processor 201 with high-speed memory used in the execution of computer program instructions by the processor 201. Accordingly, system memory 203 may include memory components, such as such as static RAM (SRAM), dynamic RAM (DRAM), or NAND Flash memory, suitable for supporting high-speed memory operations by the processor 201. In certain embodiments, system memory 203 may combine both persistent, non-volatile memory, and volatile memory.

In certain embodiments, system memory 203 may be comprised of multiple removable memory modules. System memory 203 in the illustrated embodiment includes removable memory modules 205a-n. Each of the removable memory modules 205a-n may correspond to a printed circuit board memory socket that receives a removable memory module 205a-n, such as a DIMM (Dual In-line Memory Module), that can be coupled to the socket and then decoupled from the socket as needed, such as to upgrade memory capabilities or to replace faulty components. Other embodiments of IHS system memory 203 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each processor 201. All or portions of the chipset may be implemented directly within the integrated circuitry of an individual processor 201. The chipset may provide the processor 201 with access to a variety of resources accessible via one or more buses 206. Various embodiments may utilize any number of buses to provide the illustrated pathways served by bus 206. In certain embodiments, bus 206 may include a PCIe (PCI Express) switch fabric that is accessed via a PCIe root complex. IHS 200 may also include one or more I/O ports 207, such as PCIe ports, that may be used to couple the IHS 200 directly to other IHSs, storage resources or other peripheral components. In certain embodiments, the I/O ports 207 may provide couplings to the backplane of the chassis in which the IHS 200 is installed.

As illustrated, a variety of resources may be coupled to the processor 201 of the IHS 200 via bus 206. For instance, processor 201 may be coupled to a network controller 208, such as provided by a Network Interface Controller (NIC) that is coupled to the IHS 200 and allows the IHS 200 to communicate via an external network, such as the Internet or a LAN. As illustrated, network controller 208 may report information to a remote access controller 209 via an out-of-band signaling pathway that is independent of the operating system of the IHS 200.

Processor 201 may also be coupled to a power management unit 211 that may interface with power supply unit 108 of chassis 100 in which an IHS 200, such as a compute sled 101a-n, may be installed. In certain embodiments, a graphics processor 212 may be comprised within one or more video or graphics cards, or an embedded controller, installed as components of IHS 200. In certain embodiments, graphics processor 212 may be an integrated part of the remote access controller 209 and may be utilized to support the display of diagnostic and administrative interfaces related to IHS 200 via display devices that are coupled, either directly or remotely, to remote access controller 209.

As illustrated, IHS 200 may include one or more FPGA (Field-Programmable Gate Array) card(s) 213. Each of the FPGA cards 213 supported by IHS 200 may include various processing and memory resources, in addition to an FPGA integrated circuit that may be reconfigured after deployment of IHS 200 through programming functions supported by FPGA card 213. Each individual FGPA card 213 may be optimized to perform specific processing tasks, such as specific signal processing, security, data mining, and artificial intelligence functions, and/or to support specific hardware coupled to IHS 200. In certain embodiments, such specialized functions supported by an FPGA card 213 may be utilized by IHS 200 in support of certain computing solutions. As illustrated, FPGA 213 may report information to the remote access controller 209 via an out-of-band signaling pathway that is independent of the operating system of the IHS 200.

IHS 200 may also support one or more storage controllers 214 that may be utilized to provide access to virtual storage configurations. For instance, storage controller 214 may provide support for RAID (Redundant Array of Independent Disks) configurations of storage drives 215a-n, such as storage drives provided by storage sleds 102a-n and/or JBOD 115 of FIG. 1. In some embodiments, storage controller 214 may be a HBA (Host Bus Adapter). Storage controller 214 may report information to the remote access controller 209 via an out-of-band signaling pathway that is independent of the operating system of the IHS 200.

In certain embodiments, IHS 200 may operate using a BIOS (Basic Input/Output System) that may be stored in a non-volatile memory accessible by the processor(s) 201. The BIOS may provide an abstraction layer by which the operating system of the IHS 200 interfaces with the hardware components of the IHS. Upon powering or restarting IHS 200, processor 201 may utilize BIOS instructions to initialize and test hardware components coupled to the IHS, including both components permanently installed as components of the motherboard of IHS 200, and removable components installed within various expansion slots supported by the IHS 200. The BIOS instructions may also load an operating system for use by the IHS 200. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 209.

In certain embodiments, remote access controller 209 may operate from a different power plane from the processors 201 and other components of IHS 200, thus allowing the remote access controller 209 to operate, and management tasks to proceed, while the processing cores of IHS 200 are powered off. As described, various functions provided by the BIOS, including launching the operating system of the IHS 200, may be implemented by the remote access controller 209. In some embodiments, the remote access controller 209 may perform various functions to verify the integrity of the IHS 200 and its hardware components prior to initialization of the IHS 200 (i.e., in a bare-metal state).

Remote access controller 209 may include a service processor 216, or specialized microcontroller, that operates management software that supports remote monitoring and administration of IHS 200. Remote access controller 209 may be installed on the motherboard of IHS 200 or may be coupled to IHS 200 via an expansion slot provided by the motherboard. In support of remote monitoring functions, network adapter 220 may support connections with remote access controller 209 using wired and/or wireless network connections via a variety of network technologies.

In some embodiments, remote access controller 209 may support monitoring and administration of various devices 208, 213, 214 of an IHS via a sideband interface. In such embodiments, the messages in support of the monitoring and management function may be implemented using MCTP (Management Component Transport Protocol) that may be transmitted using I2C sideband bus connections 217a-c established with each of the respective managed devices 208, 213, 214. As illustrated, the managed hardware components of the IHS 200, such as FPGA cards 213, network controller 208 and storage controller 214, are coupled to the IHS processor 201 via an in-line bus 206, such as a PCIe root complex, that is separate from the I2C sideband bus connection 217a-c.

In certain embodiments, the service processor 216 of remote access controller 209 may rely on an I2C co-processor 218 to implement sideband I2C communications between the remote access controller 209 and managed components 208, 213, 214 of the IHS. The I2C co-processor 218 may be a specialized co-processor or micro-controller that is configured to interface via a sideband I2C bus interface with the managed hardware components 208, 213, 214 of IHS. In some embodiments, the I2C co-processor 218 may be an integrated component of the service processor 216, such as a peripheral system-on-chip feature that may be provided by the service processor 216. Each I2C bus 217a-c is illustrated as single line in FIG. 2. However, each I2C bus 217a-c may be comprised of a clock line and data line that couple the remote access controller 209 to I2C endpoint controllers 208a, 213a, 214a.

As illustrated, the I2C co-processor 218 may interface with the individual managed devices 208, 213, and 214 via individual sideband I2C buses 217a-c selected through the operation of an I2C multiplexer 219. Via switching operations by the I2C multiplexer 219, a sideband bus connection 217a-c may be established by a direct coupling between the I2C co-processor 218 and an individual managed device 208, 213, or 214.

In providing sideband management capabilities, the I2C co-processor 218 may interoperate with corresponding endpoint I2C controllers 208a, 213a, 214a that implement the I2C communications of the respective managed devices 208, 213, 214. The endpoint I2C controllers 208a, 213a, 214a may be implemented as a dedicated microcontroller for communicating sideband I2C messages with the remote access controller 209, or endpoint I2C controllers 208a, 213a, 214a may be integrated SoC functions of a processor of the respective managed device endpoints 208, 213, 214.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processors 201 as a systems-on-a-chip (SOC).

In some embodiments, the remote access controller 209 may include or may be part of a baseboard management controller (BMC). As a non-limiting example of a remote access controller 209, the integrated Dell Remote Access Controller (iDRAC) from Dell® is embedded within Dell PowerEdge™ servers and provides functionality that helps information technology (IT) administrators deploy, update, monitor, and maintain servers remotely. In other embodiments, chassis management controller 110 may include or may be an integral part of a baseboard management controller. Remote access controller 209 may be used to monitor, and in some cases manage computer hardware components of IHS 200. Remote access controller 209 may be programmed using a firmware stack that configures remote access controller 209 for performing out-of-band (e.g., external to a computer's operating system or BIOS) hardware management tasks. Remote access controller 209 may run a host operating system (OS) 221 on which various agents execute. The agents may include, for example, a service module that is suitable to interface with remote access controller 209 including, but not limited to, an iDRAC service module (iSM).

Figure 3:
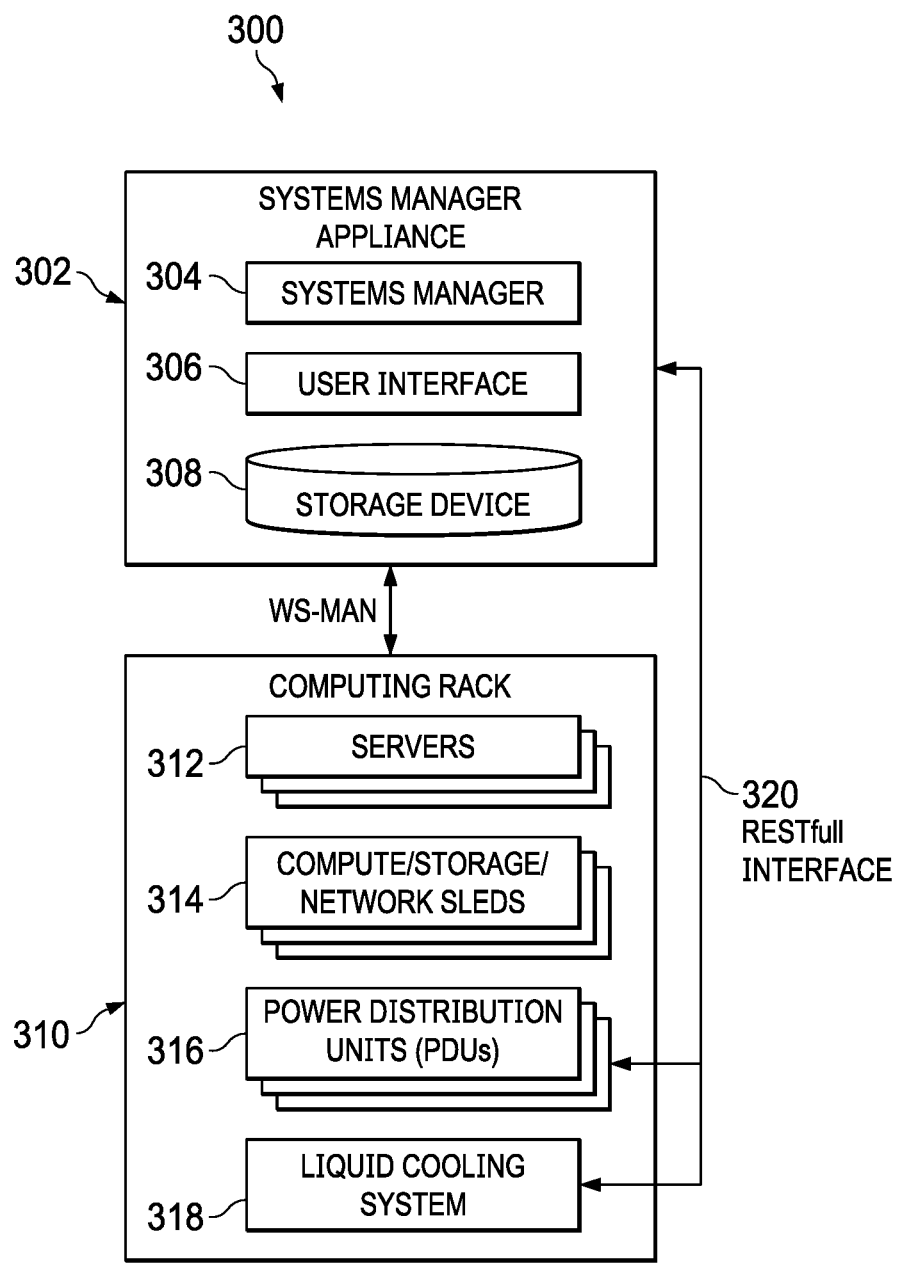
FIG. 3 illustrates several components of an example liquid cooling leakage monitoring and abatement system according to one embodiment of the present disclosure.

FIG. 3 illustrates several components of an example liquid cooling leakage monitoring and abatement system 300 according to one embodiment of the present disclosure. The liquid cooling leakage monitoring and abatement system 300 includes a systems manager appliance 302 installed with a systems manager 304, a user interface 306, and a storage device 308. The liquid cooling leakage monitoring and abatement system 300 monitors and controls the operation of various components of a computing rack 310 including multiple servers 312, one or more compute/storage/network sleds 314, power distribution units (PDUs) 316, and a liquid cooling system 318. In one embodiment, systems manager 304 includes at least a portion of the Dell EMC OpenManage Enterprise (OME) that is installed on a virtual machine (VM), such as a VMWARE Workstation embodied as the system manager appliance 302.

In one embodiment, the systems manager 304 communicates with the computing rack 310 using a direct connection (e.g., WS-Man, etc.) and communicates with PDUs 316 and liquid cooling system 318 using a RESTful interface 320. Liquid cooling system 318 may be any suitable type that cools the components (e.g., servers 312, compute/storage/network sleds 314, PDUs 316, etc.) using a liquid coolant. For example, the liquid cooling system 318 may have a pump that circulates a liquid that has been chilled through a radiator and through cold plates configured on the principal heat generating components (e.g., processors, etc.) of each of the components. In many cases, the liquid is delivered from the radiator to the cold plates via conduits or flexible tubing. Nevertheless, the conduits can, and often do, develop leaks over time due to various factors including mis-handling, abrasion, tearing, inadequate connector seals, and the like.

When such leaks inevitably occur, it would be beneficial to alert users of the computing rack 310 as soon as possible so that damage caused by the liquid may be kept to a minimum. In one embodiment, the RAC 209 of each component continually monitors the liquid cooling system 318 for leaks such that when a leak is detected, it sends an appropriate message to the systems manager 304 to alert the user.

In another embodiment, the systems manager 304 may include logic for performing one or more remediation operations for abating damage that may occur because of a leak in the liquid cooling system 318. For example, the liquid cooling system 318 may be configured with multiple valves that can shut down certain portions of the liquid cooling system 318. When the systems manager 304 receives an indication that a leak has occurred, it may determine which valves to turn off so that the leak damage may be mitigated. In other cases, the systems manager 304 may include logic for turning off the pump or reducing the speed of the pump.

According to embodiments of the present disclosure, the systems manager 304 may include logic for when a first components exhibits a leak, it may then infer one or more other components that may potentially be affected by the leak. For example, the systems manager 304 may maintain location information for each component 312, 314, 316 in the computing rack 310 such that, when a leak occurs, it can infer other components 312, 314, 316 that may potentially be affected due to their location relative to the first component that developed the leak. Furthering this example, the systems manager 304 identifies those components 312, 314, 316 that are located to the side and/or below (underneath) the leaking component to infer that they may be affected by the leaking component.

In one embodiment, the systems manager 304 may estimate a flowrate of the leak, and based on this information, estimate a propagation rate at which the liquid coolant affects one or more other of the components over time. That is, the systems manager 304 calculates the propagation rate over a specified distance during an ongoing leak.

Figure 4A:
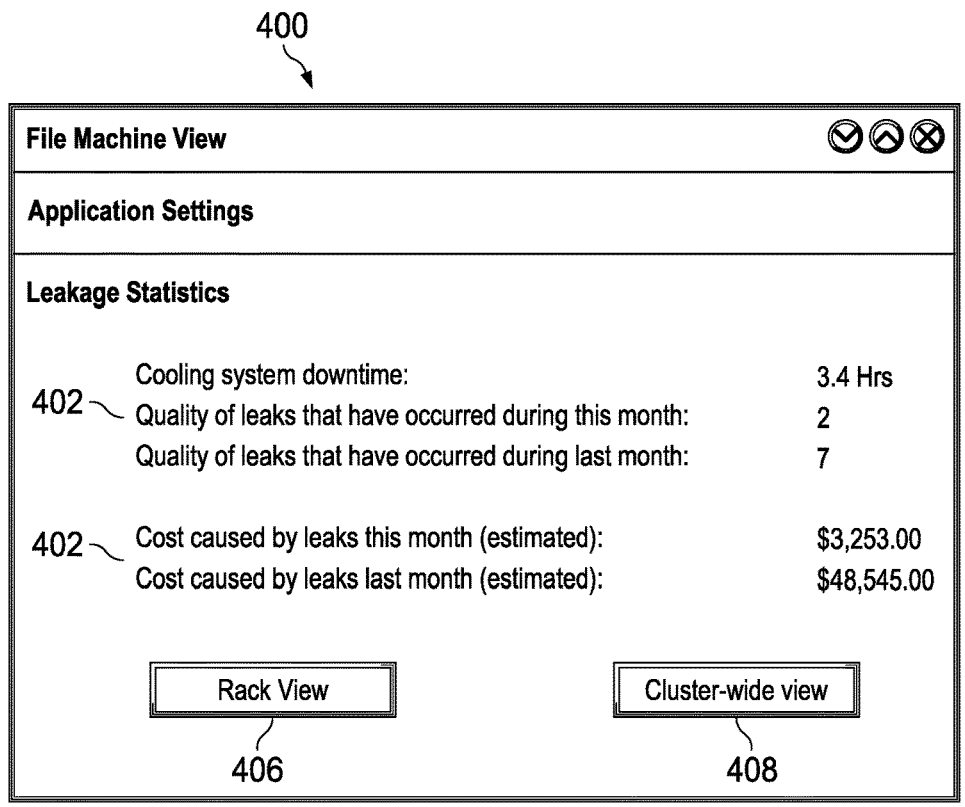
FIGS. 4A-4C illustrate example windows that may be generated by the systems manager to implement the liquid cooling leakage monitoring and abatement system.
Figure 4B:
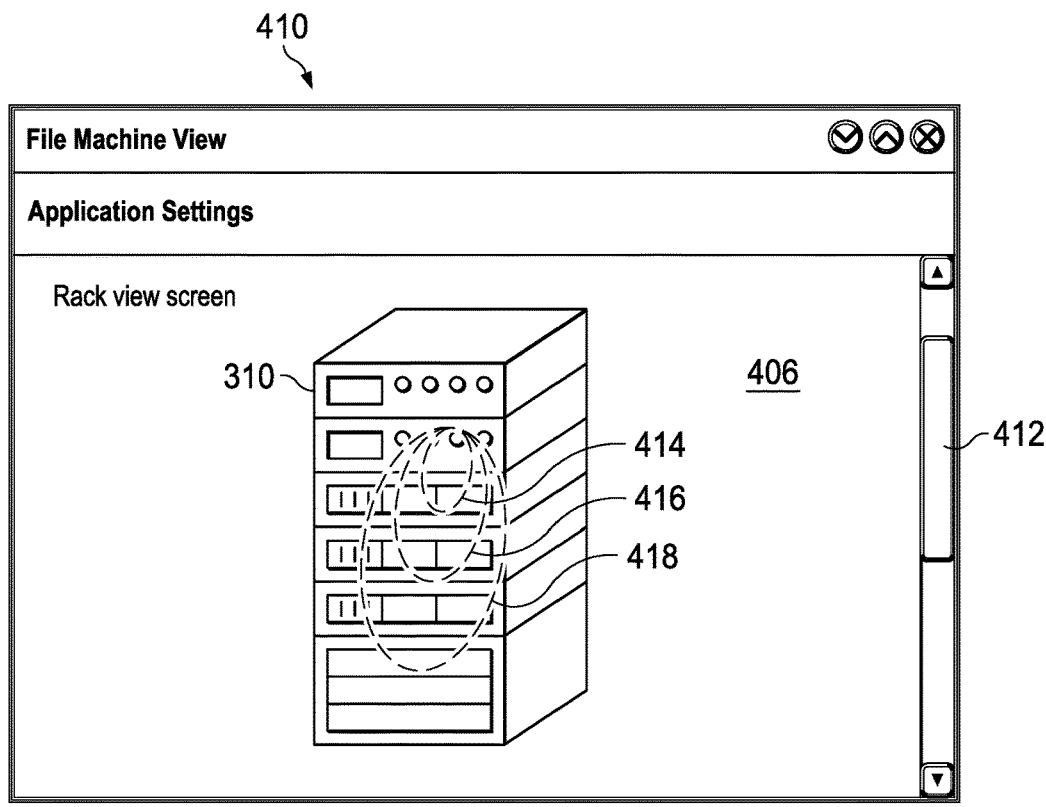
Figure 4C:
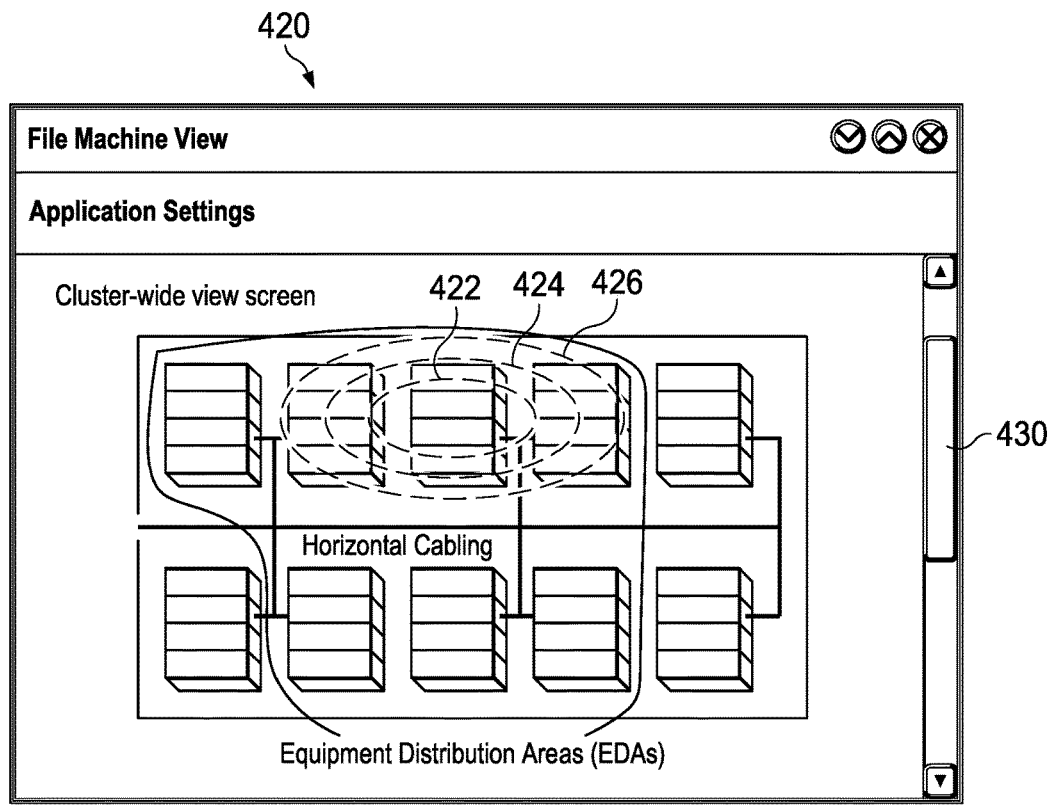

FIGS. 4A-4C illustrate example windows that may be generated by the systems manager 304 to implement the liquid cooling leakage monitoring and abatement system according to one embodiment of the present disclosure. In particular, FIG. 4A illustrates a splash screen 400, FIG. 4B illustrates a rack view screen 410, and FIG. 4C illustrates cluster-wide view screen 420 that may be generated by the systems manager 304.

The systems manager 304 may generate the splash screen 400 at any suitable time, such as when a user desires to view the health of the liquid cooling system 318 of its associated computing rack 310. The splash screen 400 provides several elements of information that may be useful to the user. For example, the splash screen 400 may display one or more statistical factors 402 associated with the operation of the liquid cooling system 318, such as cooling system downtime, a quantity of leaks that have occurred during a current time period and/or one or more previous time periods. In one embodiment, the systems manager 304 may receive user input associated with diagnostic information about how the leak was fixed so that it can display statistical information about the failure modes of leaks having occurred in the past.

In one embodiment, the systems manager 304 may generate statistical cost estimations 404 showing a monetary cost incurred due to those historical leaks. For example, the systems manager 304 may receive user input associated with certain components of the computing rack 310 that were damaged due to the leak, obtain cost information associated with each damaged component 312, 314, 316, and estimate a cost figure showing an approximate cost incurred due to the leaks.

The splash screen 400 also includes a rack view screen button 406 and a cluster-wide view screen button 408 that when selected by the user, causes the systems manager 304 to display the rack view screen 410 and cluster-wide view screen 420, respectively.

Referring now to FIG. 4B, the rack view screen 410 generally shows a visual map or arrangement of the relative locations of the various components 312, 314, 316 in the computing rack 310. In particular, the systems manager 304 may include logic for displaying a location of a component 312, 314, 316 that is leaking liquid coolant. In one embodiment, the systems manager 304 may also include logic for displaying how the leak may propagate through the computing rack 310 over time. For example, the rack view screen 410 may include a slide bar 412 that when moved by a user, overlays an estimated propagation rate through the computing rack 310. Furthering this example, the topmost position of the slide bar 412 may indicate a current coolant propagation, while the bottom most position of the slide bar 412 indicates a future period of time (e.g., 1 hour, 1 day, etc.). Example propagation rates overlaid on rack view screen 410 includes a current propagation rate 414, a propagation rate 416 estimated to occur 30 minutes in the future, and a third propagation rate 418 estimated to occur 1 hour in the future.

Referring to FIG. 4C, the cluster-wide view screen 420 generally shows a visual map or arrangement of the relative locations of the various computing racks 310 in a building, such as a data center. The systems manager 304 is configured to display leakage information on the cluster-wide view screen 420 in a manner similar to that displayed on the computing rack view screen 410; the principal difference being that a cluster-wide view screen 420 displays a map of multiple computing racks 310 in a cluster (data center), while the computing rack view screen 410 provides leakage details for a single computing rack 310.

Like the computing rack view screen 410, the systems manager 304 displays estimated propagation rates 422, 424, and 426 that alternatively may be displayed as a side bar 430 is progressively moved from left (current) to right (future).

In particular, the systems manager 304 may include logic for displaying a location of a component 312, 314, 316 that is leaking liquid coolant. In one embodiment, the systems manager 304 may also include logic for displaying how the leak may propagate through the computing rack 310 over time. For example, the rack view screen 410 may include a slide bar 412 that when moved by a user, overlays an estimated propagation rate through the computing rack 310. Furthering this example, the left most position of the slide bar 430 may indicate a current coolant propagation, while the right most position of the slide bar 430 indicates a future period of time (e.g., 1 hour, 1 day, etc.). Example propagation rates overlaid on rack view screen 410 includes a current propagation rate 422, a propagation rate 424 estimated to occur 30 minutes in the future, and a third propagation rate 426 estimated to occur 1 hour in the future.

Figure 5:
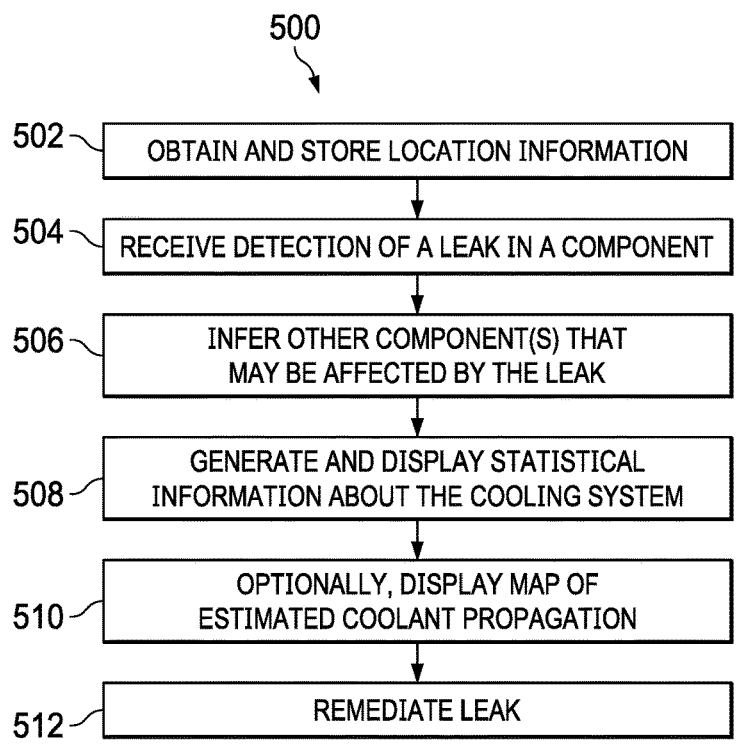
FIG. 5 illustrates an example liquid cooling leakage monitoring and abatement method that may be performed to monitor and remediate problems found in a liquid cooling system used to cool one or more computing racks according to one embodiment of the present disclosure.

FIG. 5 illustrates an example liquid cooling leakage monitoring and abatement method 500 that may be performed to monitor and remediate problems found in a liquid cooling system used to cool one or more computing racks according to one embodiment of the present disclosure. The method 500 may be performed in whole, or at least in part, by the system manager 304 used to monitor and control the operations of computing racks, such as those configured in a data center. In one embodiment, the method 500 may be performed by a plugin that is installed on the appliance 302 and configured to function with the system manager 304 to perform the various features described herein. For example, a liquid cooling leakage monitoring and abatement system plugin may be downloaded from an OEM support website and installed on the computing platform 302 by a user of the system manager 304.

At step 502, the method 500 obtains and stores location information about the components 312, 314, 316 of a computing cluster (e.g., computing rack, etc.). For example, the method 500 may perform a discovery operation to identify which components are configured in the cluster along with their relative location with respect to one another. As another example, the method 500 may receive user input for obtaining location information about the components in the computing rack.

Although the method 500 is described for use with a single computing cluster, it should be appreciated that the method 500 may be facilitated for use with any type and quantity of computing clusters. For example, the method 500 may be facilitated for use with multiple computing racks of a data center.

At step 504, the method 500 receives detection of a leak in a component 312, 314, 316. For example, the cold plate that is adapted for conveying heat from a processor on the components 312, 314, 316 may begin to leak. As such, the BMC 209 configured on that component 312, 314, 316 may, using a leak sensor, detect the leak and generate a simple network management protocol (SNMP) trap which will be relayed to the systems manager 304. The SNMP trap may also include information about which component 312, 314, 316 is leaking.

At step 506, the method 500 infers other components that may be affected by the leak. For example, the method 500 may infer that, due to the forces of gravity, another component is affected by the leak by determining that the other component is located below the first component. The method 500 may also infer that the other component is affected by the leak by determining that it is located within a specified distance from the leaking component. The method 500 may determine the specified distance by obtaining flowrate information associated with a flowrate of the leak, and using the obtained flowrate, estimate a propagation rate at which the liquid coolant comes in contact with one or more other components. For example, the method 500 may obtain information about a flowrate of the leak to be approximately 1.0 quarts-per-hour, and based upon this information infer that other components located underneath the leaking component would be affected by the leak within 15.0 minutes after the leak was first detected, and that certain other components located nearby would be affected by the leak within 30.0 minutes after the leak was first detected.

In one embodiment, the method 500 may use empirical knowledge known about the physical structure of the components to infer how and when other components may be affected by a leak in another component. For example, it may be known that a certain component has a housing that slopes down diagonally towards its rear edge such that, if a leak were to form on top of the housing, liquid coolant would pool behind and underneath the component more readily than at other areas. Thus, knowledge of this feature may be used by the method 500 to adapt or tune the rate at which other components nearby would be affected.

At step 508, the method 500 generates statistical information about the liquid cooling system 318 for view by the user. For example, the method 500 may display one or more statistical factors associated with the operation of the liquid cooling system 318, such as cooling system downtime, a quantity of leaks that have occurred during a current time period and/or one or more previous time periods. In one embodiment, the method 500 may generate statistical cost estimations 404 showing a monetary cost that has been incurred due to the historical leaks.

At step 510, the method 500 optionally displays a map of the estimated coolant propagation. A map may be particularly useful for providing a pictorial representation of the extent of the leak so that users may identify and locate affected components in a relatively quick and efficient manner.

At step 512, the method 500 remediates the leak condition. For example, the method 500 may remediate the leak condition by controlling the cooling system to turn off the flow of liquid coolant (e.g., turn off valve, remove power from coolant pump, etc.) to any affected components. As another example, the method 500 may remediate the leak condition by generating an alert message to notify personnel who are responsible for the operation of the computing cluster. As another example, the method 500 may remediate the leak condition by migrating workloads away from the affected components. That is, the method 500 may, upon determining that a particular component is affected by a leak, identify certain workloads (e.g., running applications) that are currently being executed on the affected component, identify another unaffected component that has sufficient capacity for executing those workloads, and migrating those workloads to the unaffected component.

Following remediation of the leak, the method 500 continues processing at step 504 for ongoing monitoring of the liquid cooling system 318 for leaks. Nevertheless, when use of the method 500 is no longer needed or desired, the method 500 ends.

Although FIG. 5 describes one example of a method that may be performed for continual monitoring of leaks in a liquid cooled computing cluster, the features of the disclosed process may be embodied in other specific forms without deviating from the spirit and scope of the present disclosure. For example, the method 500 may perform additional, fewer, or different operations than those operations as described in the present example. As another example, certain steps of the aforedescribed process may be performed by the system manager 304, a plugin downloaded from an OEM support website, or even by the BMC 209 that initially detected the leak.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A liquid cooling leakage abatement system comprising:
   a systems manager stored in at least one memory and executed by at least one processor to:
   obtain location information for each of a plurality of components of a computing cluster, at least a portion of the components cooled by a liquid cooling system using a liquid coolant; and
   when the systems manager receives leakage information associated with a leak in the liquid cooling system that is used to cool a first component:
   infer, using the obtained location information, a second component that is affected by the leak by determining that the second component is located within a specified distance from the first component;
   to determine the specified distance:
   obtain flowrate information associated with a flowrate of the leak; and
   using the obtained flowrate, estimate a propagation rate at which the liquid coolant contacts one or more other of the components, the propagation rate comprising the specified distance over an ongoing duration of the leak; and
   generate an alert message indicating the first and second components that are affected by the leak.

2. The liquid cooling leakage abatement system of claim 1, wherein the systems manager is further executed to infer that the second component is affected by the leak by determining that the second component is located below the first component, the first and second components configured in the same computing rack.

3. The liquid cooling leakage abatement system of claim 1, wherein the systems manager is further executed to display a map of the computer cluster, and display an overlay of the estimated propagation rate of the liquid coolant over the map.

4. The liquid cooling leakage abatement system of claim 1, wherein the systems manager is further executed to communicate with the liquid cooling system to shut off a flow of the liquid to the computing cluster.

5. The liquid cooling leakage abatement system of claim 4, wherein the systems manager is further executed to, prior to shutting off the flow of liquid, communicating with the first component to migrate one or more workloads supported by the first component to another one or more of the components.

6. The liquid cooling leakage abatement system of claim 1, wherein the systems manager is further executed to:
   store a record associated with each leakage event that occurs to the computing cluster over time, the leak comprising one of the leakage events;
   calculate a statistical histogram for a plurality of the leakage events; and
   display the statistical histogram for view by a user.

7. The liquid cooling leakage abatement system of claim 6, wherein the systems manager is further executed to:
   obtain cost information associated with a cost of each of the components;
   determine an overall cost due to the leakage events over time; and
   display the overall cost for view by the user.

8. The liquid cooling leakage abatement system of claim 1, wherein each of the components comprises at least one of a computing blade, a computing server, a power distribution unit (PDU), an input/output (I/O) device, a networking device, and a storage unit.

9. A liquid cooling leakage abatement method comprising:
  obtaining, using instructions stored in at least one memory and executed by at least one processor, location information for each of a plurality of components of a computing cluster, at least a portion of the components cooled by a liquid cooling system using a liquid coolant; and
  when leakage information associated with a leak in the liquid cooling system that is used to cool a first component is received:
    inferring, using the instructions, a second component that is affected by the leak using the obtained location information by determining that the second component is located within a specified distance from the first component;
    to determine the specified distance:
      obtain flowrate information associated with a flowrate of the leak; and
      using the obtained flowrate, estimate a propagation rate at which the liquid coolant contacts one or more other of the components, the propagation rate comprising the specified distance over an ongoing duration of the leak; and
    generating, using the instructions, an alert message indicating the first and second components that are affected by the leak.

10. The liquid cooling leakage abatement method of claim 9, further comprising inferring that the second component is affected by the leak by determining that the second component is located below the first component, the first and second components configured in the same computing rack.

11. The liquid cooling leakage abatement method of claim 9, further comprising displaying a map of the computer cluster, and displaying an overlay of the estimated propagation rate of the liquid coolant over the map.

12. The liquid cooling leakage abatement method of claim 9, further comprising communicating with the liquid cooling system to shut off a flow of the liquid to the computing cluster.

13. The liquid cooling leakage abatement method of claim 9, further comprising, prior to shutting off the flow of liquid, communicating with the first component to migrate one or more workloads supported by the first component to another one or more of the components.

14. The liquid cooling leakage abatement method of claim 9, further comprising:
  storing a record associated with each leakage event that occurs to the computing cluster over time, the leak comprising one of the leakage events;
  calculating a statistical histogram for a plurality of the leakage events; and
  displaying the statistical histogram for view by a user.

15. The liquid cooling leakage abatement method of claim 14, further comprising:
  obtaining cost information associated with a cost of each of the components;
  determining an overall cost due to the leakage events over time; and
  displaying the overall cost for view by the user.

16. A computer program product comprising a non-transitory computer readable storage medium having program instructions embodied therewith, the program instructions executable by a processor to cause the processor to perform a method comprising:
  obtain location information for each of a plurality of components of a computing cluster, at least a portion of the components cooled by a liquid cooling system using a liquid coolant; and
  when the systems manager receives leakage information associated with a leak in the liquid cooling system that is used to cool a first component:
    infer, using the obtained location information, a second component that is affected by the leak by determining that the second component is located within a specified distance from the first component;
    to determine the specified distance:
      obtain flowrate information associated with a flowrate of the leak; and
    using the obtained flowrate, estimate a propagation rate at which the liquid coolant contacts one or more other of the components, the propagation rate comprising the specified distance over an ongoing duration of the leak; and
  generate an alert message indicating the first and second components that are affected by the leak.

* * * * *